United States Patent [19]

Merrin et al.

[11] 3,911,297

[45] Oct. 7, 1975

[54] VARIABLE CAPACITANCE DIODES EMPLOYING A GLASSY AMORPHOUS MATERIAL AS AN ACTIVE LAYER AND METHODS FOR THEIR USE

[75] Inventors: Seymour Merrin, Fairfield, Conn.; Jack K. Clifton, New City, N.Y.; John S. Katsigianopoulos, Bridgeport, Conn.

[73] Assignee: Innotech Corporation, Norwalk, Conn.

[22] Filed: Mar. 16, 1973

[21] Appl. No.: 342,081

[52] U.S. Cl. .................... 307/311; 307/320; 357/2; 357/4; 357/30

[51] Int. Cl.$^2$ .................... H03K 3/42; H01L 27/14

[58] Field of Search ............ 307/311, 320; 317/234, 317/9, 10; 357/2, 4, 30

[56] References Cited

UNITED STATES PATENTS

| | | | |
|---|---|---|---|
| 3,040,262 | 6/1962 | Pearson | 317/234 UA |
| 3,435,234 | 3/1969 | Denton et al. | 317/234 R |
| 3,500,448 | 3/1970 | Forlani et al. | 317/235 R |
| 3,523,190 | 8/1970 | Goetzberger et al. | 317/234 R |
| 3,562,425 | 2/1971 | Poirier | 317/234 R |

*Primary Examiner*—John Zazworsky

*Attorney, Agent, or Firm*—Pennie & Edmonds

[57] ABSTRACT

A variable capacitance diode comprises a thin layer of a glassy amorphous material exhibiting one type of conductivity (either N or P) disposed upon a semiconductive substrate possessing the other kind of conductivity (P or N, respectively). Preferably, the glassy layer is ion impermeable so that the device remains stable under a wide range of operating conditions. These devices behave as light variable and voltage variable capacitance diodes and can be incorporated in a wide variety of circuit arrangements.

6 Claims, 5 Drawing Figures

VARIABLE CAPACITANCE DIODES EMPLOYING A GLASSY AMORPHOUS MATERIAL AS AN ACTIVE LAYER AND METHODS FOR THEIR USE

BACKGROUND OF THE INVENTION

The present invention relates to a variable capacitance diode employing a glassy amorphous material as an active layer and to circuit arrangements employing such diodes. The term glassy amorphous material, within the context of this description, defines those materials which typically exhibit only short-term ordering. The term is intended to include not only glasses, but also those "amorphous" materials which have any appreciable short-range ordering. However, it is intended to exclude both crystalline substances (such as silicon and silicon dioxide) and true amorphous materials having no appreciable ordering.

Glasses, which comprise a specific class of glassy amorphous materials, are typically quenched liquids having a viscosity in excess of about $10^8$ poise at ambient temperature. They are generally characterized by: (1) the existence of a single phase; (2) gradual softening and subsequent melting with increasing temperature, rather than sharp melting characteristics; (3) conchoidal fracture; and (4) the absence of crystalline X-ray diffraction peaks.

Devices employing glassy amorphous materials and behaving as rectifying diodes are disclosed in United States patent application Ser. No. 227,933 filed by Seymour Merrin, one of the present applicants on Feb. 22, 1972. It has further been discovered that these devices can be made to behave as voltage variable and light variable capacitance diodes.

BRIEF SUMMARY OF THE INVENTION

The present invention relates to a variable capacitance diode comprising a thin layer of glassy amorphous material exhibiting one type of conductivity (either N or P) disposed upon a semiconductive substrate possessing the other kind of conductivity (P or N, respectively). Preferably, the glassy layer is ion impermeable so that the device remains stable under a wide range of operating conditions. These devices behave as light variable and voltage variable capacitance diodes and can be incorporated in a wide variety of unique circuit arrangements.

BRIEF DESCRIPTION OF THE DRAWINGS

The advantages, nature, and various features of the present invention will appear more fully upon consideration of the illustrative embodiments now to be described in detail in connection with the accompanying drawings.

In the drawings.

DETAILED DESCRIPTION OF THE DRAWINGS

Figure 1:
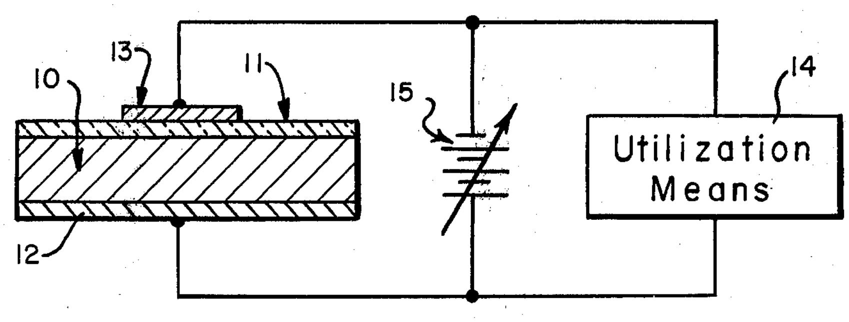
FIG. 1 is a schematic cross-section of a glassy layer-crystalline semiconductor variable capacitance diode in accordance with the invention.

Referring to the drawings, FIG. 1 is a schematic cross-section of a variable capacitance diode employing a glassy amorphous material as an active layer. The device comprises a first active layer 10 having one type of electronic conductivity such as a crystalline semiconductor substrate doped to exhibit either N-type or P-type conductivity (substrate resistivities of over 0.5 ohm-cm. are preferred). A thin, continuous active layer 11 of a glassy amorphous material possessing the other kind of electronic conductivity (P or N, respectively) is disposed adjacent the first active layer to form a diode junction with it. A pair of electrodes 12 and 13 are disposed in contact with the first active layer and the glassy layer, respectively, in order to provide an electrical path to variable capacitance diode utilization means 14. The utilization means can comprise either an integrated or a lumped parameter circuit which utilizes a variable capacitance in the electrical path between electrodes 12 and 13. A controllable voltage source 15, such as a combination of a voltage source and a voltage divider network, is electrically coupled between contact electrodes 12 and 13. The glassy layer is either sufficiently thin that the layer possesses useful conductivity as described in copending application Ser. No. 227,933, filed by Seymour Merrin and assigned to applicant's assignee or is especially treated to produce such conductivity in the manner described in copending application Ser. No. 227,932 also filed by Seymour Merrin and assigned to applicant's assignee. In the former case, the maximum thickness depends to some extent on the type of glassy material and the particular application. The layer should usually be sufficiently thin that the diode characteristics of the junction predominate over the resistive characteristics of the glassy material. Where an insulating glass is employed, the glass layer should typically be less than one and one-half microns thick and preferably less than one micron. Where glass having a bulk resistivity in the semiconducting range is used, the layer can be thicker. In the case where the glassy layer is especially treated to produce conductivity, the glassy material is given a useful level of conductivity by disposing a source of impurity ions, such as a layer of metal, on its surface and heating the glassy layer to a temperature below its melting point, at which ions of the impurity diffuse into it.

Preferably, the glassy layer is made of a glassy material which is ionically impermeable to ions of typical ambient materials, such as sodium, so that the device remains stable under a wide range of operating conditions. For this purpose, a glass layer may be defined as ionically impermeable if a capacitor using the layer as a dielectric does not show an appreciable shift in the room temperature capacitance-voltage characteristic after having been heated to the anticipated operating temperature in the presence of such materials and biased at the anticipated operating voltage for a period of 100 hours.

In general, glassy materials made predominantly from components forming ionically impermeable crystalline phases are also ionically impermeable. For example, in the case of glasses, it is known that certain compositions, such as $PbSiO_3$, $Pb_6Al_2SiO_{21}$, $ZnB_2SiO_4$, if cooled from a melt under equilibrium conditions, form crystalline phases which are ionically impermeable. Glasses made predominantly of one or more of these compositions are ionically impermeable for typical applications. Generally, glasses comprising more than 40 mole percent of such phases will be relatively good barriers to ionic contaminants, and glasses comprising 70 mole percent or more are excellent barriers.

Especially preferred are insulating ionically impermeable glasses which are thermally compatible with typical crystalline semiconductor devices, that is, insulating glasses which have a temperature coefficient of expansion compatible with that of typical semiconductor substrates and have softening temperatures below the damage temperature of typical diffused junction semiconductor devices. These glasses are found, for example, among the lead-boro-alumino-silicates, the zinc-boro silicates, and the zinc-boro-alumino-silicates.

Specific examples of preferred glass compositions are given in Tables I–II. For sedimentation depositions, the oxide components of the preferred glass composition are listed in Table I. Below each listed preferred percentage is a range (in brackets) of acceptable percentages:

TABLE I

| | | |
|---|---|---|
| $SiO_2$ | 6.6 [3–12] | mole percent |
| ZnO | 55.2 [45–65] | " |
| PbO | 2.7 [0–6] | " |
| $B_2O_3$ | 34.5 [25–40] | " |
| $Al_2O_3$ | 1.0 [0–3] | " |

where calcium oxide, barium oxide or strontium oxide, or a mixture thereof, can be substituted for ZnO in an amount up to 10 mole percent.

An alternative and satisfactory composition for a glass for sedimentation deposition is given in Table II:

TABLE II

| | | |
|---|---|---|
| $SiO_2$ | 60 [55–65] | mole percent |
| PbO | 35 [30–40] | " |
| $Al_2O_3$ | 5 [0–7] | " |

where $B_2O_3$, $V_2$, $O_5$, or $P_2O_5$, or a mixture thereof, can be substituted for $SiO_2$ and ZnO can be substituted for PbO, each substitution being limited to 20 mole percent.

These glasses can be formed in accordance with conventional techniques well-known in the art. (For preparing the glasses for sedimentation, see, for example, the technique described by W. A. Pliskin in U.S. Pat. No. 3,212,921 issued on Oct. 19, 1965.)

It has been discovered that a number of glassy materials formed predominantly of polymeric, chain-forming members having semiconductive elements as their key cations, such as silicates and borates, can be rendered N-type or P-type semiconductors by melt doping with a suitable "impurity". Specifically, these glasses can be rendered N-type or P-type by adding to the melt formula impurities to donate or accept electrons in a manner analogous to the donation and acceptance of electrons by dopants in crystalline semiconductors. In particular, the impurities added to the melt are elements or compounds of elements which are donor or acceptor dopants for the key cation of the polymeric structure. For example, silicon is the key cation in a silicate glass and $B_2O_3$ is added to the glass melt to produce P-type conductivity. Similarly, $P_2O_5$ or $V_2O_5$ is added to produce N-type conductivity. Boron is the key cation in a borate glass, and BeO produces P-type conductivity while $SiO_2$ produces N-type.

Preferably, the impurities are chosen to have approximately the same size as the key cations so that they can replace an appreciable proportion of the key cations in the glass structure. In such cases, the impurity ions can replace up to 20 mole percent or more of the key cations without significantly altering the structure of the glass. A preferred "P-type" glass for use with N-doped silicon is lead silicate glass having oxide components of PbO and $SiO_2$ in the mole ratio of 1:1 and including $B_2O_3$ in a proportion of up to 20 mole percent. A preferred "N-type" glass for use with P-doped silicon is 1:1 PbO-$SiO_2$ glass which has been melted with $V_2O_5$ or $P_2O_5$ in a proportion of up to 20 mole percent.

The device of FIG. 1 can be conveniently fabricated by depositing a thin layer of glass on the crystalline substrate using the well-known sedimentation process. The electrodes can then be deposited by, for example, vacuum evaporation or sputtering.

Figure 2:
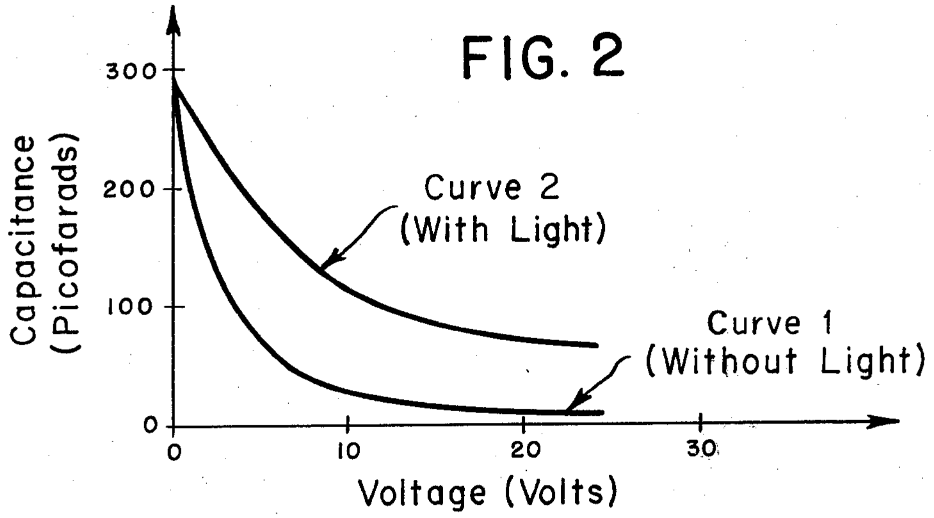
FIG. 2 is a graphical illustration showing the capacitance-voltage characteristic of a typical diode in accordance with the invention.

As a specific example of such a device, a dot of the aforementioned 1:1 P-type glass having a diameter of about 1,000 microns and a thickness of about 0.3 micron was deposited on an N-doped silicon wafer. A thin layer of copper having a thickness of a few thousand angstroms was then deposited on the glass by vacuum evaporation and a conventional ohmic contact was made with the silicon. The resulting structure acted as a diode having the capacitance-voltage characteristic shown in FIG. 2. Curve 1 of FIG. 2 shows the capacitance-voltage characteristic in the absence of light. As can be seen from this curve, successive increments of reverse bias voltage reduce the capacitance of the device. Typical values of capacitance range from 300 picofarads at zero volts to less than 5 picofarads at 10 to 30 volts. The tuning ratio in the linear portion of the curve is on the order of 30, and the exceptionally low leakage current of these devices—less than 1 nanoampere—indicates that they can be used to make tuners with commercially useful Q characteristics.

Curve 2 illustrates the capacitance-voltage characteristic of the device when exposed to moderate intensity light. As can be seen by comparing curve 2 with curve 1, exposure to light increases the capacitance of the device for any value of reverse bias voltage. When high intensity light is used (characteristic not shown), the capacitance of the device is substantially constant for all values of voltage.

Figure 3:
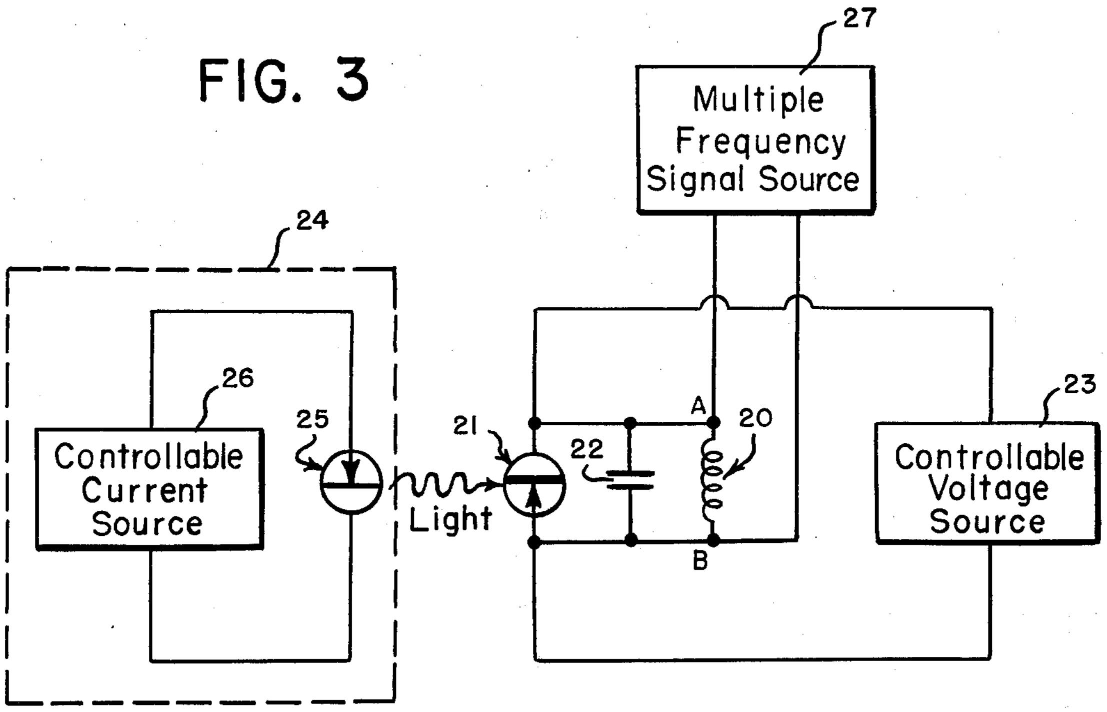
FIG. 3 is a schematic circuit diagram of a circuit, useful as a tuner, which employs a variable capacitance diode in accordance with the invention.

FIG. 3 is a schematic circuit diagram of a novel circuit in accordance with the invention. In essence, the circuit, which can for example be used as a tuner, comprises an inductance-capacitance oscillator wherein the capacitance of the oscillator includes a variable capacitance diode in accordance with the invention. More specifically, the circuit comprises an inductance-capacitance oscillator circuit having an inductance 20 and a variable capacitance diode 21 as described hereinabove. The oscillator can also include additional capacitance 22 in order to establish a predetermined base frequency for the oscillator.

The variable capacitance diode is coupled to control means comprising a controllable voltage source 23 for applying a controllable reverse bias voltage across the diode and a controllable intensity light source 24 comprising, for example, a photo-diode 25 electrically coupled to a controllable current source 26. The controllable voltage source is electrically coupled to the variable capacitance diode by hard wire connections while the controllable intensity light source is optically coupled to the variable capacitance diode by being disposed in a position to shine upon the junction thereof. Optical coupling may be facilitated by making one of the diode electrodes of transparent material such as $SnO_2$ and using a transparent glassy amorphous material. The controllable voltage source and the controllable intensity light source can be variable either in discrete steps, e.g., through the combination of a voltage source and a voltage divider, or in a continuous manner, e.g., through the use of a sliding wire resistor.

When the circuit is used as a tuner, a multiple frequency signal source 27, such as a combination of a receiving antenna and suitable amplifiers, is electrically coupled to the oscillator for applying a multiple frequency signal thereto. The signal can, for example, be coupled to the oscillator through terminals A and B across inductor 20. The capacity of variable capacitance diode 21 is then varied, by variation of controllable voltage source 23 and controllable light source 24, to a value which sets the resonance frequency of the oscillator at a predetermined value corresponding to a desired component of the multiple frequency signal. The output of the tuner may then be used as desired in any of the numerous circuits known to those skilled in the art.

In the use of the circuit as a tuner, it is often convenient to vary one of the control means in discrete steps as a channel selector and to vary the other control means continuously for fine tuning. Either the controllable voltage source 23 or the controllable intensity light source 24 can be used as the channel selector and the other of the control means can be used for fine tuning. Alternatively, both the controllable voltage source and the controllable intensity light source are each controllable in discrete steps for producing multiple discrete channel tuning.

Figure 4:
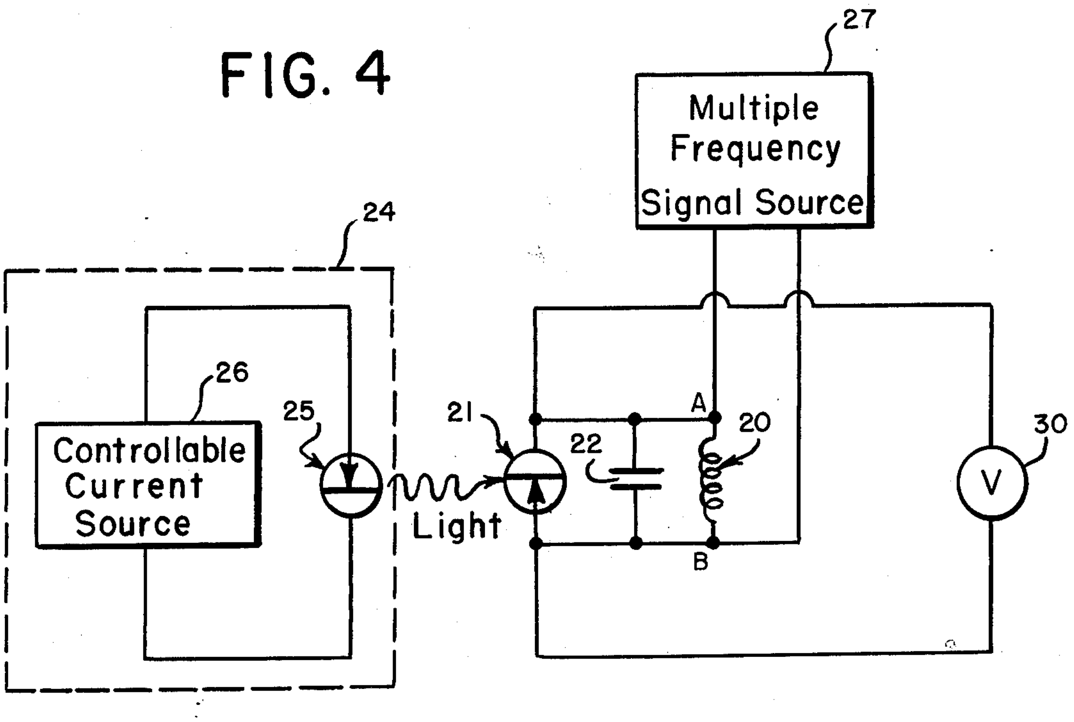
FIG. 4 is a schematic circuit diagram of second tuner circuit in accordance with the invention.

It is also possible to use the variable capacitance diode with only one variable source 23, 24. FIG. 4 is a schematic circuit diagram of an alternative circuit that is substantially identical with the circuit illustrated and described in FIG. 3 except that a constant voltage source 30 for reverse biasing variable capacitance diode 21 is substituted for the controllable voltage source. This circuit may be characterized as a light-activated tuner. Variations in the intensity of the light from source 25 vary the frequency of the oscillator. A discrete intensity light source can be used, and the difference in intensity among successive intensities can be empirically calibrated to permit channel switching by light alone. Voltage source 30 can also be set at 0 volts or removed from the circuit, and the capacitance of the device can be varied by light alone.

Figure 5:
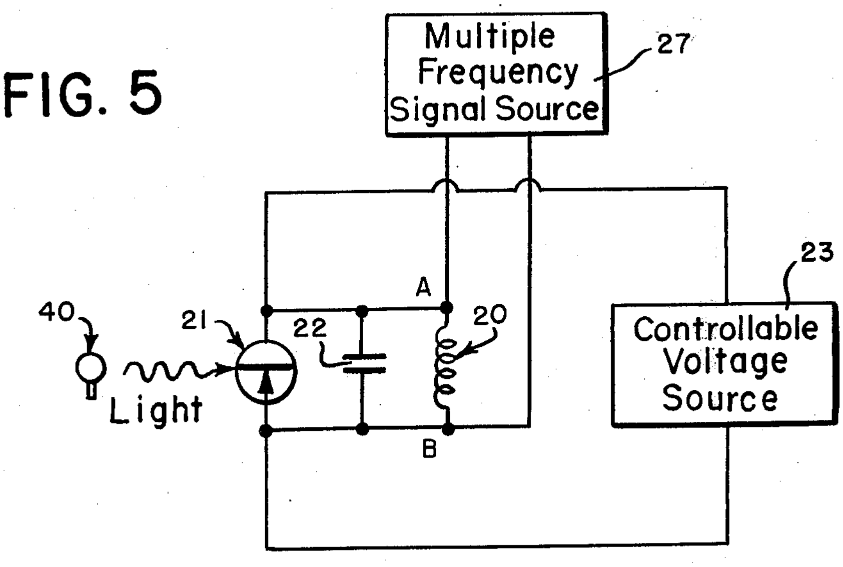
FIG. 5 is a schematic circuit diagram of yet a third tuner circuit.

FIG. 5 is a schematic circuit diagram of yet another alternative circuit that is substantially identical with the circuit illustrated and described in FIG. 3 except that a constant intensity light source 40 is substituted for the controllable intensity light source. The intensity of the light source is advantageously chosen to either reduce the slope of the capacitance-voltage characteristic of diode 21 to a desired level or to achieve a particular desired capacitance for a predetermined reverse bias voltage on the diode.

While the invention has been described in connection with a small number of specific embodiments, it is to be understood that these embodiments are merely illustrative of the many possible specific embodiments which can represent applications of the principles of the invention. In general, the variable capacitance diode of this invention may be used in any circuit in which a variable capacitor is desired and it is possible to apply a variable voltage source or a variable light source, or both, to the capacitor. For example, in addition to its use in tuning circuits described above, applications for the variable capacitance diode may be found in providing selectively variable RC time constants, filtering characteristics, phase shifts and the like. Numerous and varied arrangements can be devised by those skilled in the art without departing from the spirit and scope of the present invention.

We claim:

1. In combination:

a light variable capacitance diode comprising:

a substrate of semiconductor material exhibiting a first kind of electronic conductivity;

disposed upon said substrate, a layer of glassy amorphous material exhibiting the other kind of electronic conductivity, a diode junction being formed thereby;

a first conductive means for making ohmic contact with said substrate;

second conductive means for making electrical contact with said layer of glassy amorphous material;

a source of controllable intensity light optically coupled to said diode junction for supplying light to the junction; and means for varying the intensity of light from said controllable intensity source thereby varying the capacitance between said first and second conductive means.

2. A variable capacitance diode according to claim 1 wherein at least one of said conductive means is substantially transparent to light from said source.

3. A device according to claim 1 wherein said voltage supply means is a controllable voltage source for supplying a continuously variable range of voltages.

4. A device according to claim 1 wherein said voltage supply means is a controllable voltage source for supplying a discretely variable series of voltages.

5. A device according to claim 1 wherein said source of light of a source of controllable intensity light for supplying a continuously variable range of light intensities.

6. A device according to claim 1 wherein said source of light is a source of controllable intensity light for supplying a discretely variable series of light intensities.

* * * * *

UNITED STATES PATENT AND TRADEMARK OFFICE

CERTIFICATE OF CORRECTION

PATENT NO. : 3,911,297

DATED : October 7, 1975

INVENTOR(S) : Seymour Merrin et al.

It is certified that error appears in the above-identified patent and that said Letters Patent are hereby corrected as shown below:

Col. 3, line 50 delete "$V_2$, $O_5$" and substitute -- $V_2O_5$" --;

Col. 6, line 58 delete "of" (second occurrence) substitute -- is --.

Signed and Sealed this

*second* Day of *March 1976*

[SEAL]

*Attest:*

RUTH C. MASON
*Attesting Officer*

C. MARSHALL DANN
*Commissioner of Patents and Trademarks*